(12) United States Patent
Safar

(10) Patent No.: US 8,716,676 B2
(45) Date of Patent: May 6, 2014

(54) DEVICE TO LOAD TEM SAMPLE HOLDERS INTO A VACUUM CHAMBER

(75) Inventor: George Safar, LaHonda, CA (US)

(73) Assignee: XEI Scientific, Inc., Redwood City, CA (US)

( * ) Notice: Subject to any disclaimer, the term of this patent is extended or adjusted under 35 U.S.C. 154(b) by 0 days.

(21) Appl. No.: 13/555,632

(22) Filed: Jul. 23, 2012

(65) Prior Publication Data

US 2013/0032732 A1 Feb. 7, 2013

Related U.S. Application Data

(60) Provisional application No. 61/515,187, filed on Aug. 4, 2011.

(51) Int. Cl.
*G21K 5/08* (2006.01)
*G21K 5/10* (2006.01)
*F16B 7/10* (2006.01)
*F16B 7/20* (2006.01)
*F16B 7/18* (2006.01)

(52) U.S. Cl.
CPC ... *G21K 5/10* (2013.01); *F16B 7/10* (2013.01); *F16B 7/182* (2013.01); *F16B 7/20* (2013.01)
USPC ....... 250/442.11; 403/353; 403/355; 403/356

(58) Field of Classification Search
CPC ............... F16B 7/10; F16B 7/18; G21K 5/10
USPC ..................................... 403/353; 250/442.11
See application file for complete search history.

(56) References Cited

U.S. PATENT DOCUMENTS

| 4,300,443 A | * | 11/1981 | Morcos et al. ................... 99/332 |
| 4,657,616 A | | 4/1987 | Benzing |
| 5,326,971 A | | 7/1994 | Theodore et al. |
| 5,539,211 A | | 7/1996 | Ohtoshi et al. |
| 5,717,328 A | * | 2/1998 | Kerr et al. ...................... 324/149 |
| 5,753,924 A | * | 5/1998 | Swann ........................ 250/443.1 |
| 5,821,544 A | | 10/1998 | Augustus et al. |

(Continued)

FOREIGN PATENT DOCUMENTS

JP 2007324128 12/2007

OTHER PUBLICATIONS

Roberts, Zaluzec, Walck, Grant, Applications of Reactive Gas Plasma Cleaning Technology in Minimizing Contamination of Specimens During Transmission and Analytical Electron Microscopy, vol. 480—1997 MRS Spring Meeting—Symposium Z—Specimen Preparation for Transmission Electron Microscopy . . . IV, Abstract.

*Primary Examiner* — Jack Berman
*Assistant Examiner* — James Choi
(74) *Attorney, Agent, or Firm* — Mark D. Perdue

(57) ABSTRACT

A device is described that allows for the insertion and removal of a Transmission Electron Microscope (TEM) specimen stage and insertion rod into and out of a vacuum chamber. The device can be configured to accommodate specimen stage and insertion rods manufactured by all TEM producers. The device has a side-entry slot for accepting the cylindrical stage rod and a locking mechanism, such that unwanted contact with the specimen and the specimen stage itself is avoided during entry and exit from the plasma vacuum chamber. The devices hold said specimen stage and insertion rod in position during the process of plasma cleaning in a vacuum chamber.

11 Claims, 4 Drawing Sheets

(56) References Cited

U.S. PATENT DOCUMENTS

| | | | |
|---|---|---|---|
| 6,176,703 B1 * | 1/2001 | Gugel et al. | 433/120 |
| 6,213,672 B1 * | 4/2001 | Varga | 403/109.2 |
| 6,226,068 B1 * | 5/2001 | Arcykiewicz et al. | 439/314 |
| 6,242,737 B1 | 6/2001 | Ohnishi et al. | |
| 6,281,510 B1 | 8/2001 | Yoshitake et al. | |
| 6,452,315 B1 | 9/2002 | Vane | |
| 6,667,475 B1 | 12/2003 | Parran et al. | |
| 7,737,416 B2 | 6/2010 | Gunji et al. | |
| 7,767,979 B2 | 8/2010 | Dona | |
| 8,011,259 B2 | 9/2011 | Dona | |
| 2004/0108067 A1 | 6/2004 | Fischione et al. | |
| 2005/0230636 A1 * | 10/2005 | Tanaka et al. | 250/440.11 |
| 2010/0230592 A1 | 9/2010 | Gunji et al. | |
| 2011/0017247 A1 * | 1/2011 | Vane et al. | 134/198 |
| 2011/0260056 A1 | 10/2011 | Huang et al. | |
| 2013/0131683 A1 * | 5/2013 | Shah et al. | 606/93 |

* cited by examiner

DEVICE TO LOAD TEM SAMPLE HOLDERS INTO A VACUUM CHAMBER

PRIORITY CLAIM

This application claims priority to U.S. Provisional Application Ser. No. 61/515,187 filed Aug. 4, 2011, which is incorporated herein by reference for all purposes.

TECHNICAL FIELD OF THE INVENTION

The present invention relates to protecting Transmission Electron Microscope (TEM) specimens and stages on TEM sample holders when loading and unloading them to and from a vacuum chamber such as those that perform plasma-based cleaning. More specifically, the apparatus uses a side-entry slot to allow loading and unloading of the TEM sample holder into and from a vacuum chamber, thereby reducing the chances of the specimens and stages incurring physical damage or becoming contaminated during the transfer. The invention is adaptable for and compliant to TEM sample holders from different manufacturers, and changing from one type of TEM sample holder to another is accomplished using a unique mechanical cam system.

BACKGROUND OF THE INVENTION

Transmission Electron Microscopy requires very thin specimens that are transparent to a high-intensity beam of high energy electrons. To image these samples, they are placed on a small stage at the end of a long rod in ambient room conditions that is inserted into the TEM through an airlock. Both the specimen and the stage are subject to accumulating contamination before being analyzed, in particular carbon-containing contamination. The carbon contamination creates a coating on the area being struck by the electron beam that may interfere with the imaging process by creating a loss of resolution and contrast. This contamination may be removed by Plasma cleaning in a vacuum.

Plasma cleaning can be done on the specimen and stage before insertion into the TEM instrument. Such plasma cleaning processes were first described by Zaluzec in U.S. Pat. No. 5,510,624 and expanded upon by Fischione in U.S. Pat. No. 5,633,502. Plasma cleaning of the specimens and stage occurs within a vacuum chamber pumped down to a pressure level much less than atmospheric pressure. If the specimen and stage are removed from the insertion rod before plasma cleaning and then reattached to the insertion rod after plasma cleaning, there will be recontamination of the specimen and stage. U.S. Pat. No. 5,633,502 and No. 5,922,179 describe means to transfer the specimen and stage into the plasma cleaning vacuum chamber while they are still attached to the insertion rod, thus minimizing recontamination. These transfer devices are capable of handling the different types of insertion rods produced by various electron microscope manufacturers but offer only a simple pull-in/pull-out insertion method and provide no preventive measures to avoid the specimen colliding with the inside of the sleeve. These devices require a careful insertion of the rod into a cylinder. Once cleaning is finished, the rod needs to be carefully removed from the cylinder. Damage may occur to the specimen or stage during sample insertion; damage and recontamination may occur during specimen and stage removal.

SUMMARY OF THE INVENTION

It is accordingly an object of this invention, herein called the "TEM sample holder loading device", to allow for the insertion of the TEM specimen and specimen stage into a plasma cleaner vacuum chamber so that contamination on these items will be removed. The TEM specimen and specimen stage, along with the insertion rod and the alignment pin on the insertion rod, are collectively known as the "TEM sample holder." Another object of the invention is to eliminate the risk of physical or re-contamination damage to the specimen. Another object is to allow for the interchangeable use of TEM insertion rods produced by various electron microscope manufacturers.

The TEM sample holder loading device includes an accepting gate that can be welded directly to the vacuum chamber. Alternatively, it can be attached to an existing fitting or flange such as industry-standard "Conflat" or "KF" types. Both attachment methods provide an adequate vacuum seal that will allow the plasma cleaning to occur in the vacuum chamber at operating pressure well below atmospheric pressure. The end of the accepting gate inside the vacuum chamber includes a cam locking system. The other end of the accepting gate has a marking that is used to guide the TEM sample holder loader (see next paragraph) into the accepting gate.

The TEM sample holder loading device also includes the TEM sample holder loader, which is inserted into the accepting gate such that vacuum integrity is maintained. On the end of the TEM sample holder loader that is inserted into the chamber is the other part of the cam locking system, with the first part of the cam locking system being on the end of the accepting gate inside of the vacuum chamber, as previously discussed. Also on this end is a groove mark or equivalent indicator that allows the operator to guide the TEM sample holder loader into the accepting gate. The marking on the accepting gate matches the groove mark on the TEM sample holder loader when the TEM sample holder loader is inserted into the accepting gate. The other end of the TEM sample holder loader has a slotted tube with a viewing hole. Also at the other end of the TEM sample holder loader is an alignment pin groove through which the alignment pin on the insertion rod is inserted. A TEM sample holder can be inserted into the TEM sample holder loader through the slotted tube, providing a guided insertion path into the vacuum chamber, thus preventing collisions with the side walls. The viewing hole found on the side of the tube at 90° from the side-entry slot helps the user guide the TEM sample holder into the TEM sample holder loader and gives a visual guide of the position of the alignment pin on the TEM sample holder. The TEM sample holder will automatically stop during insertion once it is fully in place. This will be indicated by the alignment pin being viewable in the end of the viewing hole closest to the chamber.

Properly used, the TEM sample holder loading device eliminates the risk of physical or recontamination damage to the specimen. As a preliminary step, the TEM sample holder loader is inserted into the acceptance gate with the groove mark on each piece aligned; a clockwise turn will lock the cam system and hold the TEM sample holder loader in place, and the grooves will no longer align. Loaders for different models of TEMs can be exchanged in the loader port on the plasma cleaner chamber.

Once the TEM sample holder loader is attached to the acceptance gate, the TEM sample holder can be inserted. The specimen stage at the end of the TEM sample holder moves in the direction of the plasma cleaning area. When the TEM sample holder is parallel to the horizontal plane and the specimen stage is facing up, the alignment pin on the TEM sample holder will be in position to be inserted into the alignment pin groove on the TEM sample holder loader. The TEM sample holder is loaded into the side entry slot of the TEM sample holder loader while aligning the tip of the sample holder with the viewing aperture area. When the TEM sample holder is in the correct position prior to insertion into the vacuum chamber, the insertion rod is flush against the inner wall of the loader, but the specimen stage and the specimen do not touch the wall of the loader. Once in position, the TEM sample holder can be pushed into the chamber. The user aligns the pin on the sample holder into the groove on the loader, insuring that the holder can no longer be turned and that a guided entry of the sample holder into the chamber is maintained. Here the sample holder is considered loaded and plasma cleaning processes ensue.

When plasma cleaning is finished, the TEM sample holder is removed by pulling the rod until the sample stage is seen through the viewing hole. At this point, while maintaining parallel orientation of the TEM sample holder in relation to the TEM sample holder loader, the user may now safely remove TEM sample holder through the side entry slot on the loader. Removing the TEM sample holder loader so that it can be exchanged with one designed for a different electron microscope manufacturer can be accomplished by turning the TEM sample holder loader counterclockwise to unlock the cam system and then removing the TEM sample holder loader from the vacuum chamber.

BRIEF DESCRIPTION OF THE DRAWINGS

The present invention may be best understood from the following detailed description of the preferred embodiments of the invention, illustrated in the drawings, wherein.

DETAILED DESCRIPTION OF THE DRAWINGS

Figure 1:
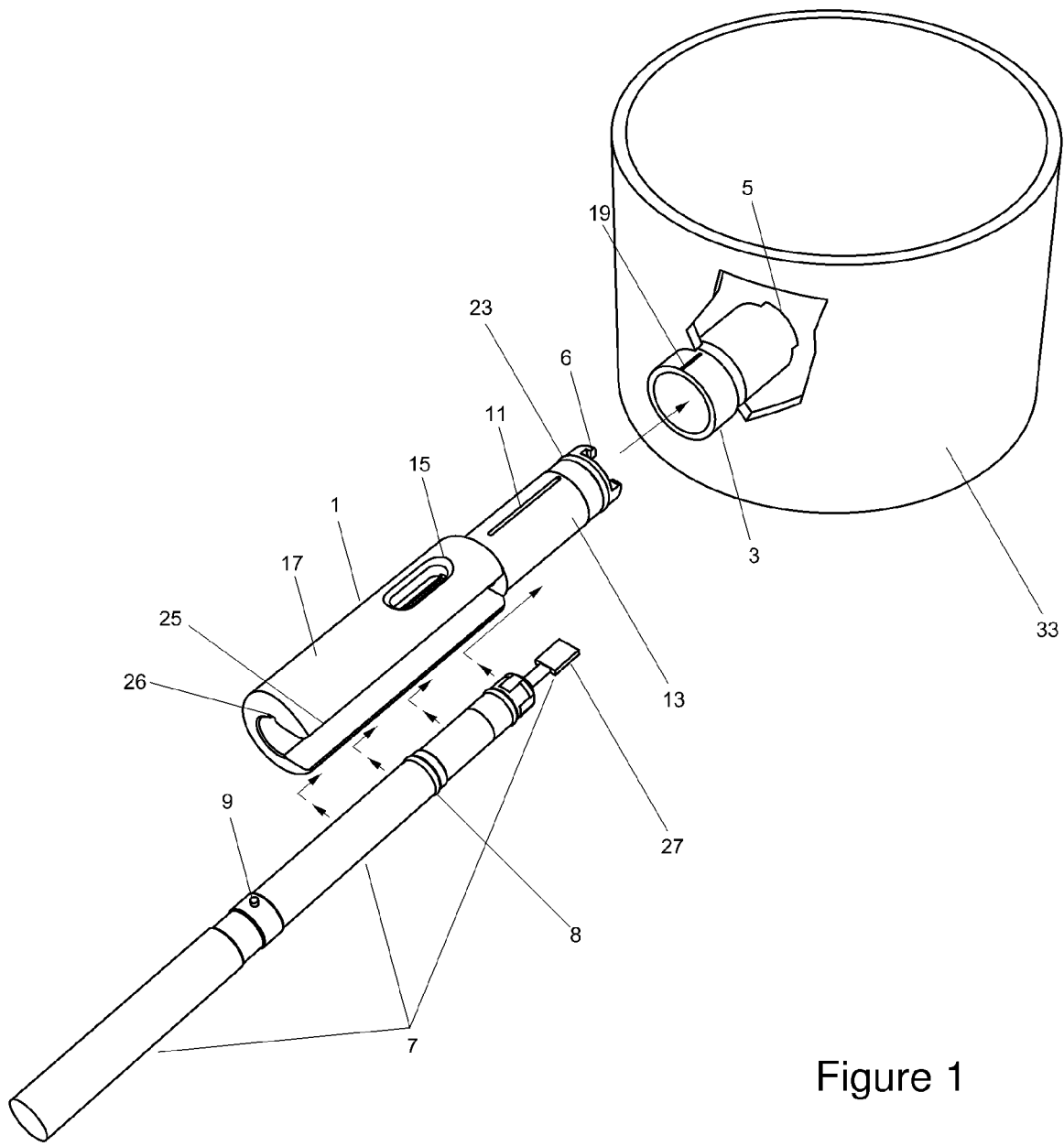
FIG. 1 is a view of the attachment order of the components. The parts shown are a standard TEM sample holder, the TEM sample holder loader, an accepting gate with a welded fitting, and a vacuum chamber.

Referring now to the Figures, a blow-up version of the preferred embodiment of the present invention is shown in FIG. 1. In this Figure, the TEM sample holder loader or loading guide 1 consists of a generally tubular sleeve 13 with a groove mark 11 and a cam locking system 6 at the end of the sleeve 13. The sleeve has a central passage through it in communication with the interior of a plasma cleaner vacuum chamber 33 through an accepting gate 3. Accepting gate 3 may be secured directly to the wall of the plasma cleaner vacuum chamber 33 or may be secured in a KF40 port as shown with reference to FIG. 2, below. A sealing surface 23 on TEM sample holder loader is on the end of the sleeve 13 before the cam locking system 6 to provide a vacuum seal. The TEM sample holder loader 1 also consists of the TEM sample holder guide 17, which itself consists of side-entry slot 25, alignment pin groove 26, and viewing hole 15. TEM sample holder guide 17 is also generally tubular and has a central passage through it in communication with the interior of the plasma cleaner vacuum chamber 33. Although TEM sample holder or loading guide is illustrated and described as having two parts 13, 17, it could be of integral construction, as well.

The TEM sample holder 7 consists of alignment pin 9, sealing surface, and TEM specimen stage 27. The acceptance gate 3 consists of cam locking system 5 and marking 19. The cam locking system 5 is located inside the plasma cleaner vacuum chamber 33. A cutout in the drawing of the plasma cleaner vacuum chamber 33 is made in order to show the location of the cam locking system 5.

Figure 3A:
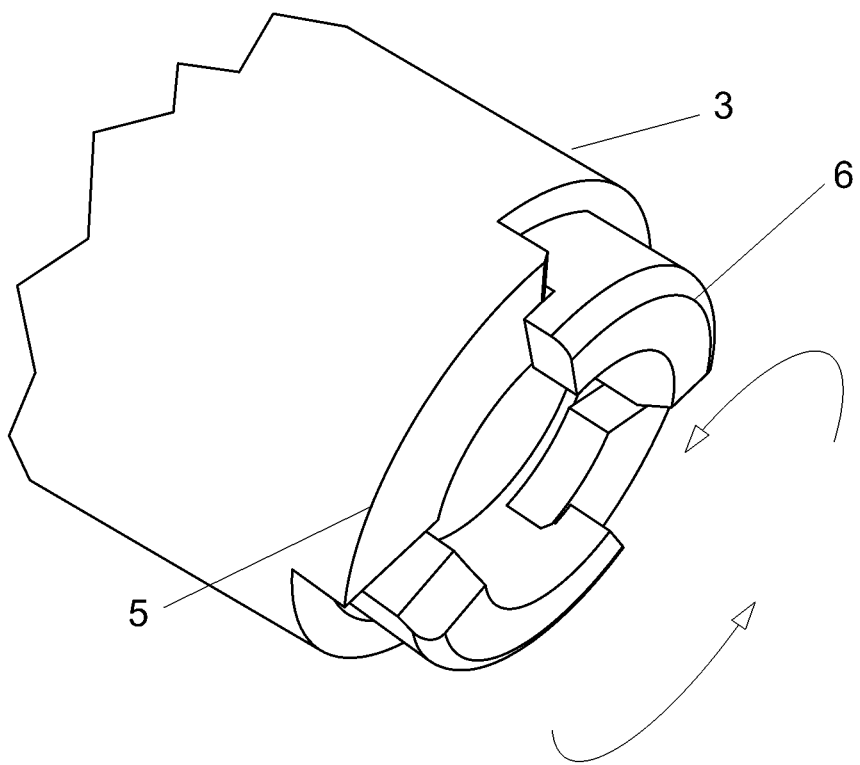
FIGS. 3a and 3b show detail of the cam locking system.

The TEM sample holder loader 1 is installed into the accepting gate 3 by aligning groove mark 11 with marking 19. The TEM sample holder loader is then rotated clockwise in order to move the cam locking system into the locked position. Further details are shown in FIG. 3a. The arrows between the TEM sample holder 7 and the TEM sample holder loader 1 shows the lateral motion needed to insert the TEM sample holder 7 into the TEM sample holder loader 1. The TEM sample holder 7 is installed into the TEM sample holder loader 1 and acceptance gate 3 by initially inserting it laterally through the side entry slot 25 into the passage of TEM sample holder guide 17. Once this insertion is complete, the TEM sample holder 7 is then pushed axially toward the plasma cleaner vacuum chamber 33. It is pushed axially through the TEM sample holder loader 1 and the accepting gate 3 until the sealing surface of the TEM sample holder 8 makes a vacuum tight seal within the TEM sample holder loader 1 and the TEM specimen stage 27 is within the plasma cleaner vacuum chamber 33. During this operation, the alignment pin 9 on the TEM sample holder 7 needs to be inserted into the alignment pin groove 26.

Figure 3B:
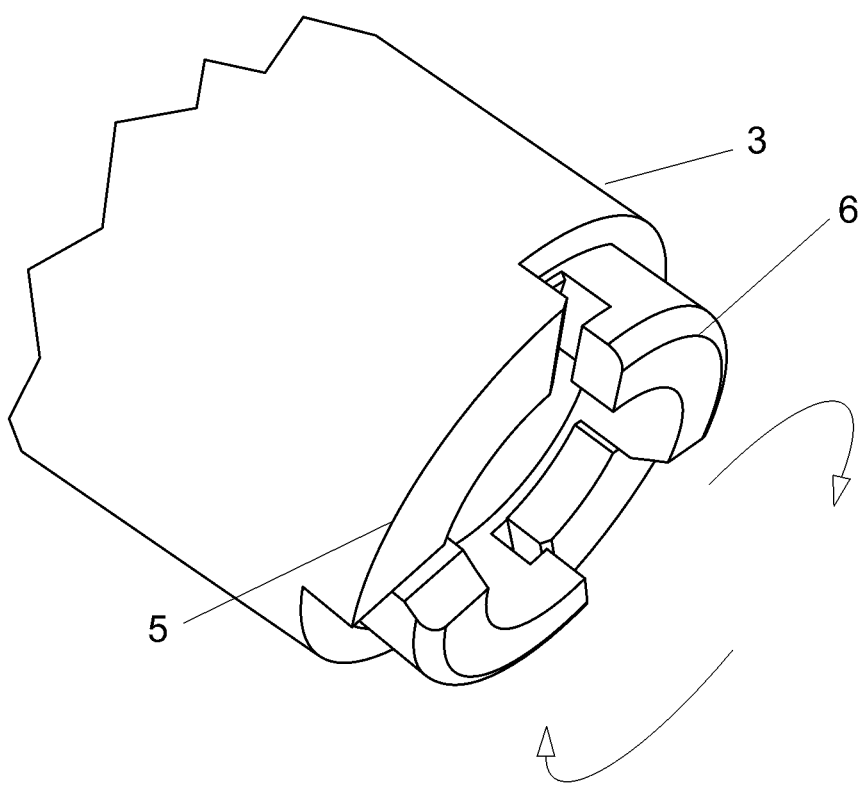

To remove the TEM sample holder 7 from the TEM sample holder loader 1, the TEM sample holder 7 is pulled away from the plasma cleaner vacuum chamber 33 until the TEM specimen stage 27 is visible through the viewing hole 15. Also the alignment pin on the TEM sample holder 9 should be clear of the alignment pin groove 26. Then, the TEM sample holder 7 is moved through the side entry slot 25 so that it is clear of the TEM sample holder guide 17. To remove the TEM sample holder loader 1, it is first rotated counter clockwise in order to move the cam locking system into the unlocked position. Further details are shown in FIG. 3b. Then, the TEM sample holder loader 1 is pulled away from the accepting gate 3.

Figure 2:
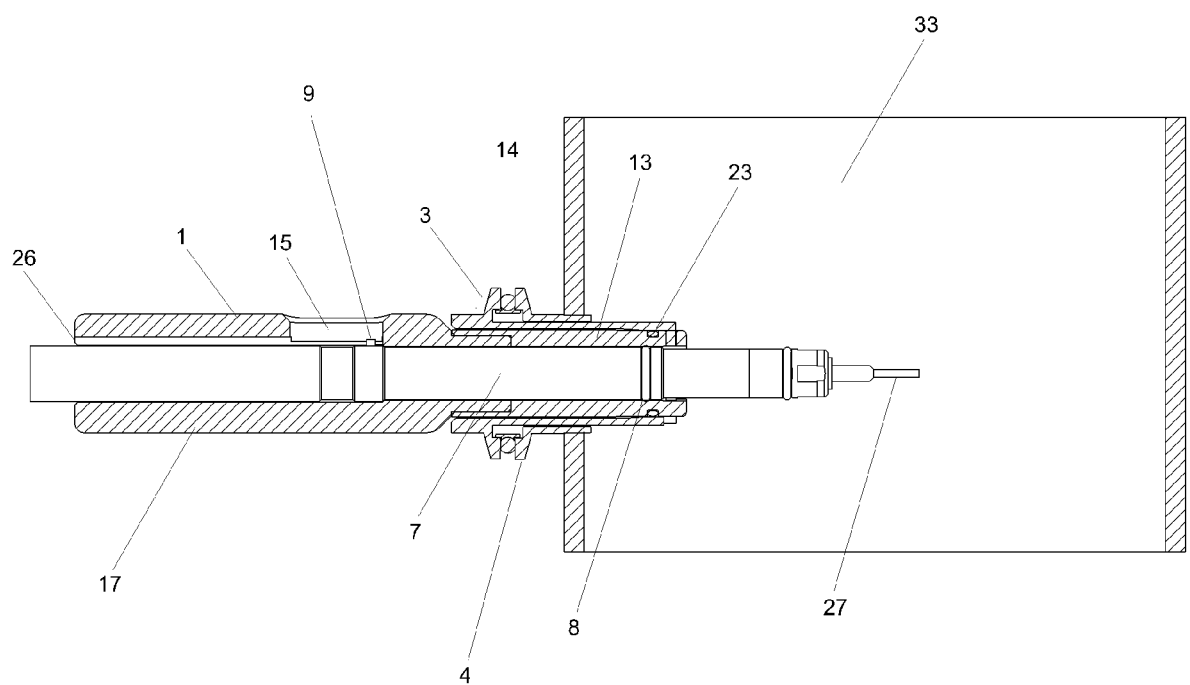
FIG. 2 is a section drawing showing a TEM sample holder inserted through the TEM sample holder loader into a vacuum chamber, in position for plasma cleaning, using a KF40 type accepting gate.

Referring now to FIG. 2, a section drawing of another preferred embodiment of the invention is shown. The plasma cleaner vacuum chamber 33 has a KF40 vacuum port 4 on it. The accepting gate 3 is connected to the KF40 port 4 with a KF40 sealing surface 14 and a KF40 clamp (not shown). The TEM sample holder loader 1 is inserted into the accepting gate 3 and locked into position with the cam system (not seen). The sealing surface on the TEM sample holder loader 23 between accepting gate 3 and TEM sample holder loader 1 maintains vacuum integrity in the plasma cleaner vacuum chamber 33. The TEM sample holder 7 is inserted into the TEM sample holder loader 1; the sealing surface on the TEM sample holder 8 also maintains vacuum integrity in the plasma cleaner vacuum chamber 33. The TEM sample holder also includes TEM specimen stage 27, which is inside the plasma chamber vacuum chamber 33 when the TEM sample holder 8 is fully inserted into the TEM sample holder loader 1 and accepting gate 3. The TEM sample holder loader 1 also consists of the viewing hole 15 and the side entry slot (not seen). The operation of this embodiment of the invention is similar to the embodiment described in FIG. 1. The only difference is that the accepting gate 3 is attached to the plasma cleaner vacuum chamber 33 with KF40 port 4.

Referring now to FIGS. 3a and 3b, the detail of the cam locking system of the accepting gate 5 at the vacuum side of accepting gate 3 and the cam locking system of the TEM sample holder loader 6 is shown. A clockwise turn of the cam locking system of the TEM sample holder loader 6 will move said system into a locked state as seen in FIG. 3a. Once in the locked state, a counter clockwise turn of the cam locking system of the TEM sample holder loader 6 will move said system into an unlocked state as seen in FIG. 3*b*.

TEM STAGE HOLDER DEVICE COMPONENT LIST

1. TEM Sample Holder Loader
3. Accepting Gate
4. Flange or Fitting for Port
5. Cam Locking System on Accepting Gate
6. Cam Locking System on TEM Sample Holder Loader
7. TEM Sample Holder
8. Sealing Surface on TEM Sample Holder
9. Alignment Pin on TEM Sample Holder
11. Groove Mark
13. Sleeve in TEM Sample Holder Loader
14. Flange or Fitting Sealing Surface
15. Viewing Hole
17. TEM Sample Holder Guide
19. Marking on Acceptance Gate
23. Sealing Surface on TEM Sample Holder Loader
25. Side-Entry Slot
26. Alignment Pin Groove
27. TEM Specimen Stage
33. Vacuum Chamber The invention has been described with reference to preferred embodiments thereof, it is thus not limited, but is susceptible to variation and modification without departing from the scope and spirit of the invention.

I claim:

1. A method for loading and unloading a transmission electron microscope (TEM) sample holder into and out of a plasma cleaner vacuum chamber while minimizing the possibility of damage or recontamination to the specimen or specimen stage by use of an entry formed in the vacuum chamber, the apparatus comprising:
    selecting a loading guide corresponding to the TEM sample holder and securing the loading guide to the vacuum chamber through an accepting gate secured to an aperture in the sample chamber;
    inserting the TEM sample holder into the loading guide laterally through a side entry slot in the loading guide;
    orienting the TEM sample holder to a selected orientation within the loading guide by registering an alignment pin on the TEM sample holder with a groove in the loading guide;
    inserting the oriented TEM sample holder axially through the loading guide and into the vacuum chamber;
    viewing the TEM sample holder while it is inserted into the loading guide using a viewing port in the loading guide; and
    removing the TEM sample holder while viewing it through the viewing port to insure that the specimen stage and specimen have properly cleared the loading guide.

2. An apparatus for loading a transmission electron microscope (TEM) sample holder into a vacuum chamber while minimizing the possibility of damage or recontamination to the specimen or specimen stage by use of an entry formed in the vacuum chamber, the apparatus comprising:
    a generally tubular loading guide having a passage therethrough;
    an accepting gate into which the loading guide is inserted, the accepting gate secured to an aperture in the vacuum chamber;
    a longitudinal slot formed in the loading guide to permit lateral loading and unloading of a TEM sample holder into the loading guide followed by axial insertion of the TEM sample holder into the vacuum chamber through the passage in the loading guide;
    a viewing port formed in the loading guide to permit viewing of the passage from an exterior of the loading guide;
    an alignment pin groove formed in the loading guide and engaging with a corresponding pin on the TEM sample holder to guide it through the loading guide; and
    a sealing surface to create a vacuum seal between the loading guide and the accepting gate.

3. The apparatus according to claim 2, wherein the accepting gate is welded to the vacuum chamber.

4. The apparatus according to claim 2, wherein the accepting gate is secured to a flange or fitting port on the vacuum chamber.

5. The apparatus according to claim 2, further comprising a locking member on the loading guide to releasably secure it to the accepting gate.

6. The apparatus according to claim 5, wherein the loading guide is dimensioned to receive a TEM sample holder specific to a TEM manufacturer and having a locking member configured to engage a locking member provided by the same TEM manufacturer.

7. An apparatus for loading a transmission electron microscope (TEM) sample holder into a vacuum chamber of a TEM comprising:
    an accepting gate secured to an aperture in the wall of the vacuum chamber and communicating with an interior of the vacuum chamber;
    a loading guide configured to be received in and form a vacuum seal with the accepting gate, the loading guide having a passage through it in communication with the interior of the vacuum chamber when the loading guide is received in the accepting gate;
    a longitudinal slot formed in the loading guide to permit lateral loading and unloading of a TEM sample holder into the passage in the loading guide and axial insertion of the TEM sample holder into the interior of the vacuum chamber through the loading guide and accepting gate;
    a viewing port formed in the loading guide separate from the longitudinal slot to permit viewing of the passage from an exterior of the loading guide; and
    an alignment pin groove formed in the loading guide and engaging with a corresponding pin on the TEM sample holder to guide it through the loading guide.

8. The apparatus according to claim 7, wherein the accepting gate is welded to the vacuum chamber.

9. The apparatus according to claim 7, wherein the accepting gate is secured to a flange or fitting port on the vacuum chamber.

10. The apparatus according to claim 7, further comprising a locking member on the loading guide to releasably secure it to the accepting gate.

11. The apparatus according to claim 10, wherein the loading guide is dimensioned to receive a TEM sample holder specific to a TEM manufacturer and having a locking member configured to engage a locking member provided by the same TEM manufacturer.

* * * * *